(12) United States Patent
Bosshart (10) Patent No.: US 6,978,387 B2
(45) Date of Patent: Dec. 20, 2005

(54) HOLD TIME LATCH WITH DECREASED PERCHARGE NODE VOLTAGE LEAKAGE

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 553 days.

(21) Appl. No.: 10/307,035

(22) Filed: Nov. 29, 2002

(65) Prior Publication Data

US 2004/0104745 A1 Jun. 3, 2004

(51) Int. Cl.$^7$ .......................... G06F 1/16; H03K 19/094
(52) U.S. Cl. .......................... 713/300; 326/98; 326/121
(58) Field of Search ............................... 713/300, 500, 713/600; 326/98; 320/98, 121

(56) References Cited

U.S. PATENT DOCUMENTS

| 5,917,355 A | 6/1999 | Klass |
| 6,002,292 A | 12/1999 | Allen et al. |
| 6,040,716 A * | 3/2000 | Bosshart ...................... 326/98 |

(Continued)

FOREIGN PATENT DOCUMENTS

EP 0880231 A1 * 11/1998 ........ H03K 19/096

(Continued)

OTHER PUBLICATIONS

Atila Alvandpour, et al., "A Low-Leakage Dynamic Multi-Ported Register File in 0.13βm CMOS" Proceedings of the 2001 International Symposium on Low Power Electronics and Design, pp. 68-71, Aug. 6, 2001.

Primary Examiner—Thomas Lee
Assistant Examiner—Mark Conolly
(74) Attorney, Agent, or Firm—Alan K. Stewart; W. James Brady, III; Frederick J. Telecky, Jr.

(57) ABSTRACT

A dynamic logic hold time latch (20). The latch comprises a first phase circuit (12') operable in a precharge phase and an evaluate phase and a second phase circuit (22) operable in a precharge phase and an evaluate phase. The precharge phase and the evaluate phase of the second phase circuit are out of phase with respect to the precharge phase and the evaluate phase of the first phase circuit. The first phase circuit comprises a precharge node ($12'_{PN}$) to be precharged to a precharge voltage during the precharge phase of the first phase circuit and operable to be discharged during the evaluate phase of the first phase circuit. The first phase circuit also comprises an output ($12'_{OUT}$) for providing a signal in response to a state at the precharge node of the first phase circuit. The second phase circuit comprises a precharge node ($14'_{PN}$) to be precharged to the precharge voltage during the precharge phase of the second phase circuit and operable to be discharged during the evaluate phase of the second phase circuit. The second phase circuit also comprises a conditional discharge path ($14'_L$, $14'_{DT}$) connected to the precharge node of the second phase circuit and operable, during the evaluate phase of the second phase circuit and in response at least in part to the output of the first phase circuit, to conditionally couple the precharge node of the second phase circuit to a voltage different than the precharge voltage. The second phase circuit also comprises voltage maintaining circuitry ($22_{Kp1}$, $22_{Kp2}$), coupled to receive the output of the first phase circuit, for coupling the precharge voltage to the precharge node of the second phase circuit during the evaluate phase of the second phase circuit in response to the output of the first phase circuit providing a first value.

37 Claims, 6 Drawing Sheets

U.S. PATENT DOCUMENTS 6,242,952 B1 * 6/2001 Bosshart et al. ............... 326/98
6,246,266 B1 * 6/2001 Bosshart ...................... 326/98
6,469,953 B1 * 10/2002 Hong .................... 365/230.08
6,791,365 B2 * 9/2004 Bosshart ...................... 326/98

FOREIGN PATENT DOCUMENTS

EP    1087529 A2 *  3/2001   .......... H03K 19/00
JP    0336015 A  * 12/1998   ........ H03K 19/096

* cited by examiner

HOLD TIME LATCH WITH DECREASED PERCHARGE NODE VOLTAGE LEAKAGE

CROSS-REFERENCES TO RELATED APPLICATIONS

This application is related to U.S. patent application Ser. No. 10/307,183, entitled "Dynamic Logic Circuits Using Transistors Having Differing Threshold Voltages And Delayed Low Threshold Voltage Leakage Protection", and filed on the same date as the present application.

STATEMENT REGARDING FEDERALLY SPONSORED RESEARCH OR DEVELOPMENT

Not Applicable.

BACKGROUND OF THE INVENTION

The present embodiments relate to electronic circuit devices and are more particularly directed to a hold time latch with reduced voltage leakage at its output precharge node.

Electronic circuits have become prevalent in numerous applications, including uses for devices in personal, business, and other environments. Demands of the marketplace affect many aspects of circuit design, including factors such as device power consumption and speed. Various electronic circuits now implement what is known in the art as dynamic, or domino, logic. Dynamic logic circuitry operates in two phases, a precharge phase during which various precharge nodes are precharged to a first voltage, and an evaluate phase during which the data is read based on the voltage at the precharge node, where the precharge voltage therefore may be read as a first logic state if undisturbed or where that precharge voltage may be first discharged and then read as a second logic state that is complimentary to the first logic state. Further, dynamic logic often passes signals through two or more stages, so that an evaluation by a first stage that discharges the first stage precharge node results in an output to the input of a second stage, and where that signal also thereby triggers a discharge of a precharge node in the second stage. In this manner, a number of stages may be triggered as the evaluate phases of the stages overlap and the output of each stage propagates through to the next successive stage.

In one type of dynamic logic, the signals pass from one stage having a first control clock to a second stage having a delayed second clock. In these circuits, there is a designed overlap between the first and second clocks so that the second stage is in its evaluate phase long enough to be triggered by the output of the first stage, yet the first stage returns to its precharge phase while the second stage thereafter for some period of time remains in its evaluate phase. It is during the time that the first stage output remains valid, known as the hold time, that the subsequent stage is typically able to trigger (i.e., evaluate) based on then-valid data from the first stage. As a result, such a circuit is often referred to as a hold time latch. Consequently, data may propagate through this as well as similar connections without the need for complicated additional latching circuitry. Once the first stage returns to its precharge phase, however, the output it provides to the second stage is no longer valid, since that output is then subject to the precharge operation of the first stage. Accordingly, it is also known in the art to include feedback transistors, also referred to as keeper transistors, connected to the output of the second stage in order to maintain its output state steady during the time when the first stage returns to its precharge phase. The feedback arises in that each keeper transistor has its gate controlled by the second stage output and is coupled to provide a maintenance voltage at the precharge node of the second stage. More particularly, often both a p-channel transistor and an n-channel transistor are connected as keeper transistors, where if the second stage output is low then the keeper p-channel transistor is enabled to keep a high voltage at the second stage precharge node, while if the second stage output is high then the keeper n-channel transistor is enabled to keep a low voltage at the second stage precharge node.

By way of further background, it has heretofore been recognized that current may leak from the second stage precharge node during its evaluate phase in the instance when the first stage provides, or was providing, a low output during the evaluate phase of the first stage. Specifically, under these conditions, the discharge path of the second stage is not enabled due to the low output of the first stage; however, current may leak through the second stage disabled transistor that is receiving the low data output from the first stage. Indeed, it is known in the art that the particular second stage data-receiving transistor may be a so-called low threshold voltage ("LVT") transistor, where such transistors are sometimes used in a discharge path in order to increase the speed of that path when the path is enabled. In such a case, each LVT transistor has a relatively lower threshold transistor as compared to other transistors in the same circuit, and such other transistors are therefore referred to as high threshold voltage ("HVT") transistors. Indeed, for numerous additional details relating to such an approach and related aspects, the reader is invited to review U.S. Pat. No. 5,831,451, entitled "Dynamic Logic Circuits Using Transistors Having Differing Threshold Voltages," issued Nov. 3, 1998, having the same inventor and assignee of the subject application, and U.S. Pat. No. 5,821,778, entitled "Using Cascode Transistors Having Low Threshold Voltages," issued Oct. 13, 1998, having the same inventor and assignee of the subject application, where both of these two patents are hereby incorporated herein by reference. In any event, the use of an LVT transistor correspondingly provides increased leakage when it is not enabled and, as such, when implemented in the discharge path of a hold time latch, that transistor increases leakage when that discharge path is not enabled. Increased leakage is undesirable because it increases device power consumption and, indeed, if severe, may jeopardize the proper operation of the hold time latch.

While the preceding approaches implemented with respect to hold-time latches have proven satisfactory in many applications, the leakage in the discharge path of the second stage may be unacceptable, particularly when the leakage in that path is increased due to the use in the path of one or more LVT n-channel transistors. Further, while the p-channel keeper transistor may provide some current to compensate for the leakage of an LVT n-channel transistor in the second stage discharge path, it has been recognized in connection with the preferred embodiments that such an approach alone may not be satisfactory for various reasons. Specifically, in order for the p-channel keeper transistor to serve its purpose in this regard, the current it provides when enabled (i.e., the "on-current" of the p-channel transistor) must be sufficiently larger than the leakage current of the LVT n-channel transistor (i.e., the "off-current" of the n-channel transistor). However, this goal is becoming increasingly more difficult because there are various factors that are tending to decrease the ratio of the on-current of the HVT p-channel transistor relative to the off-current of the LVT n-channel transistor. For example, as the system source voltage, $V_{DD}$, decreases in circuit design as is the current trend, the above-described current ratio decreases. As another factor, transistor threshold voltage is a function of temperature, that is, high temperatures decreases threshold voltage, and this too decreases the subject current ratio. As still another factor, there is a trend to build many low threshold voltage transistors in a manner to provide more drive current, once more decreasing the above-discussed ratio. Finally, n-channel transistors are stronger in current provision than p-channel transistors, still again decreasing the above-discussed ratio. With these factors, note therefore that the HVT p-channel transistor attempts to source sufficient current to compensate for the leakage of the LVT n-channel transistor, but in that attempt an increasingly larger amount of voltage is dropped across the HVT p-channel transistor, particularly in a relative sense as its strength is reduced relative to that of the n-channel transistor. The increase in voltage drop may be detrimental for various reasons, including calling into question the reliability of data validity of the hold time latch.

Given the preceding, the preferred embodiments seek to improve upon the limitations and drawbacks of the prior art, as discussed in detail below.

BRIEF SUMMARY OF THE INVENTION

In the preferred embodiment, there is a dynamic logic hold time latch. The latch comprises a first phase circuit operable in a precharge phase and an evaluate phase and a second phase circuit operable in a precharge phase and an evaluate phase. The precharge phase and the evaluate phase of the second phase circuit are out of phase with respect to the precharge phase and the evaluate phase of the first phase circuit. The first phase circuit comprises a precharge node to be precharged to a precharge voltage during the precharge phase of the first phase circuit and operable to be discharged during the evaluate phase of the first phase circuit. The first phase circuit also comprises an output for providing a signal in response to a state at the precharge node of the first phase circuit. The second phase circuit comprises a precharge node to be precharged to the precharge voltage during the precharge phase of the second phase circuit and operable to be discharged during the evaluate phase of the second phase circuit. The second phase circuit also comprises a conditional discharge path connected to the precharge node of the second phase circuit and operable, during the evaluate phase of the second phase circuit and in response at least in part to the output of the first phase circuit, to conditionally couple the precharge node of the second phase circuit to a voltage different than the precharge voltage. The second phase circuit also comprises voltage maintaining circuitry, coupled to receive the output of the first phase circuit, for coupling the precharge voltage to the precharge node of the second phase circuit during the evaluate phase of the second phase circuit in response to the output of the first phase circuit providing a first value.

In another aspect of the preferred embodiment, the first value provided by the first phase circuit is a value that is disabling to at least one switching device in the conditional discharge path of the second phase circuit.

Other aspects are also disclosed and claimed.

BRIEF DESCRIPTION OF THE SEVERAL VIEWS OF THE DRAWING

FIG. 1b illustrates a timing diagram of the operation of the prior art system of FIG. 1a.

DETAILED DESCRIPTION OF THE INVENTION

Figure 1A:
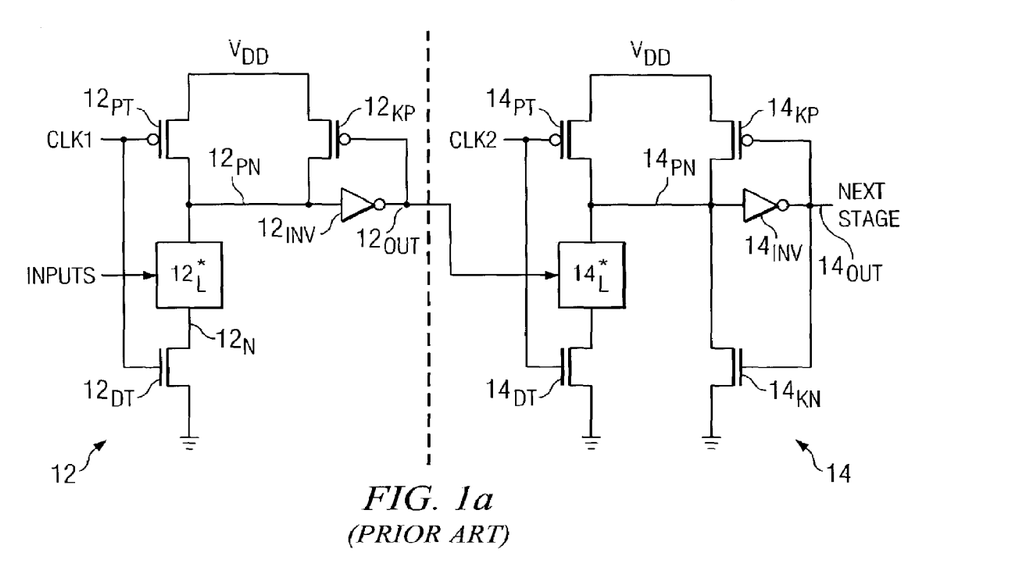
FIG. 1a illustrates a schematic of a prior art dynamic logic circuit system which in the art is referred to as a hold time latch.
Figure 1B:
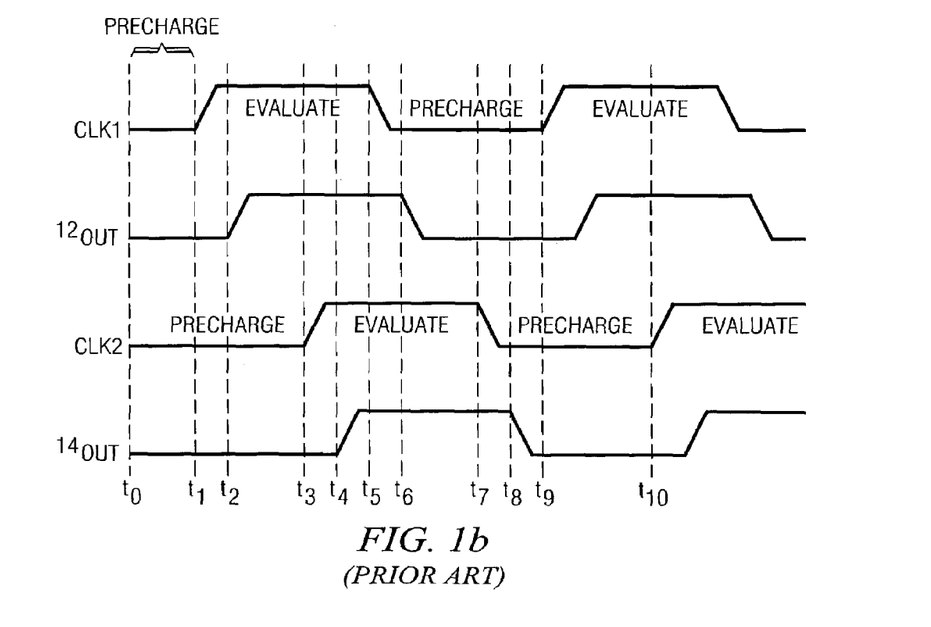

By way of background to the preferred embodiments, FIGS. 1a and 1b are now discussed to provide additional context and detail with respect to the prior art. Specifically, FIG. 1a illustrates a schematic of a prior art dynamic logic circuit system designated generally at 10, and which in the art is sometimes referred to as a hold time latch. System 10 includes circuitry operating in two different phases and, therefore, a vertical dashed line generally separates those phase circuits. Looking to the left of the dashed line, a phase 1 circuit 12 includes a dynamic (or sometimes referred to as a "domino") logic circuit stage, which includes a precharge transistor $12_{PT}$, a precharge node $12_{PN}$, an output inverter $12_{INV}$, a p-channel keeper transistor $12_{KP}$, and a conditional discharge path including both a logic circuit $12_L$ and a discharge transistor $12_{DT}$, where this path is referred to as conditional because, as shown below, it permits a discharge along the entire path if the inputs to the devices along that path are enabling. To the right side of the dashed line of FIG. 1a is a phase 2 circuit 14 which includes a dynamic logic stage, and which is similarly connected to include a precharge transistor $14_{PT}$, a precharge node $14_{PN}$, an output inverter $14_{INV}$, a p-channel keeper transistor $14_{KP}$, an n-channel keeper transistor $14_{KN}$, and a conditional discharge path including both a logic circuit $14_L$ and a discharge transistor $14_{DT}$. Each circuit 12 and 14 has a respective clock signal CLK1 and CLK2 controlling the phase operation of the circuit, and as known in the art these signals may be provided by a single clock by inverting that clock in one phase circuit relative to the other, or separate clock signals may be used. To facilitate the discussion of certain aspects of the preferred embodiments later, separate clock signals CLK1 and CLK2 are shown so as to emphasize certain effects pertaining to the overlapping period of when these signals are both high. A more detailed discussion of the various connections and interactions of phase circuits 12 and 14 is provided immediately below.

With respect to phase 1 circuit 12, precharge transistor $12_{PT}$ is a p-channel transistor which is typically smaller than the n-channel transistors shown in FIG. 1a. Precharge transistor $12_{PT}$ has a source connected to a source of the system voltage level (e.g., $V_{DD}$) and a drain connected to precharge node $12_{PN}$. CLK1 is connected to the gate of precharge transistor $12_{PT}$ and it is also connected to the gate of discharge transistor $12_{DT}$. Discharge transistor $12_{DT}$ is an n-channel transistor having its source connected to a low reference voltage (e.g., ground) and its drain connected to a node $12_N$. Between precharge node $12_{PN}$ and node $12_N$ is connected a logic circuit $12_L$. The particular logic of logic circuit $12_L$ may implement any type of logic equation. For example, often logic circuit $12_L$ includes numerous n-channel transistors connected in various fashions to implement a logic equation, and the logic function of that equation is determined based on the particular transistor configuration as well as the respective input signals connected to the gates of those transistors. For purposes of the present discussion, the particular logic equation and inputs are not important and, thus, the word INPUTS is generally shown with it understood that such signals may come from any of various other circuits, being static, dynamic, or both. Moreover, preferably the n-channel transistor(s) within logic circuit $12_L$ have a relatively low threshold voltage relative to the n-channel discharge transistor $12_{DT}$ and relative to p-channel keeper transistor $12_{KP}$, where again a greater discussion of such "LVT" transistors is provided in the U.S. Pat. Nos. 5,831,451 and 5,821,778, incorporated earlier in the Background Of The Invention section of this document. To designate the use of LVT transistors, FIG. 1a also labels logic circuit $12_L$ with an asterisk. In any event, once the logic equation formed by logic circuit $12_L$ is true, a conductive path is formed through one or more LVT transistor(s) in logic circuit $12_L$, thereby connecting precharge node $12_{PN}$ to node $12_N$ and doing so in a relatively quick fashion due to the LVT nature of these transistors. Further, recall that CLK1 is connected to the gate of discharge transistor $12_{DT}$. Thus, when the CLK1 is high then discharge transistor $12_{DT}$ is also conducting; if this conduction occurs while the logic equation implemented by logic circuit $12_L$ is true, then a discharge path is created from precharge node $12_{PN}$, through logic circuit $12_L$ and discharge transistor $12_{DT}$, to ground such that the precharge voltage (i.e., from $V_{DD}$) at precharge node $12_{PN}$ is permitted to discharge to ground.

Returning to precharge node $12_{PN}$, it is further connected to the input of output inverter $12_{INV}$. The output of output inverter $12_{INV}$ provides the output signal, $12_{OUT}$, for phase 1 circuit 12 (i.e., the result of the logic equation of logic circuit $12_L$). Output $12_{OUT}$ is connected to the gate of the p-channel keeper transistor $12_{KP}$, which has its source connected to $V_{DD}$ and its drain connected to precharge node $12_{PN}$. As a result, once the precharge voltage is no longer connected to precharge node $12_{PN}$, the p-channel keeper transistor will maintain (i.e., "keep") a high signal at the input of inverter $12_{INV}$ so long as precharge node $12_{PN}$ is not discharged by its corresponding discharge path.

With respect to phase 2 circuit 14, most of its circuit elements are generally connected in the same manner as phase 1 circuit 12 detailed above, with the exception of the inputs to its logic circuit $14_L$ as well as its output, $14_{OUT}$. With respect to the input to logic circuit $14_L$, note that the phase 1 circuit 12 output, $12_{OUT}$, is shown generally as an input to logic circuit $14_L$. This representation is intended to depict that output $12_{OUT}$ controls, at least in part, whether a discharge path is enabled in the second phase circuit 14 from its precharge node $14_{PN}$ to ground; in other words, if such a discharge path is to be enabled, then for sake of demonstrating the prior art and also by way of later demonstrating the preferred embodiments, it is presumed that at least output $12_{OUT}$ must be asserted. Other inputs, discussed later, may in addition affect whether a discharge occurs in phase 2 circuit 14. With respect to output $14_{OUT}$ as provided by inverter $14_{INV}$, in addition to being connected to the gate of a p-channel keeper transistor $14_{KP}$, output $14_{OUT}$ is connected to the gate of n-channel keeper transistor $14_{KN}$, which has its source connected to ground and its drain is connected to the input of inverter $14_{INV}$. Lastly, the remaining inputs and outputs of phase 2 circuit 14 are discussed below, while the other circuit details are not re-stated here since the reader is referred to the above discussion of phase 1 circuit 12 for comparable details.

Logic circuit $14_L$, like logic circuit $12_L$, also realizes a logic equation using one or more LVT n-channel transistors. Again, the particular equation realized is not critical, but for reasons set forth below it should be noted that at least one of the inputs to perform the equation of logic circuit $14_L$ requires an input signal which is provided by output $12_{OUT}$ from phase 1 circuit 12. Thus, note that logic circuit $14_L$ is enabled only if at least an asserted enabling output is provided by inverter $12_{INV}$ to logic circuit $14_L$.

Turning to the output, $14_{OUT}$, of phase 2 circuit 14, it is shown to merely pass on to a next stage (not shown). This illustration is shown in this manner by way of example and, therefore, the connectivity to the output is not critical to an understanding of the present introductory discussion. Thus, the output could connect to various different circuits, such as: (1) a circuit operating according to the same phase as phase 2 circuit 14; (2) a circuit operating according to the same phase as phase 1 circuit 12; (3) a circuit operating according to a phase different than both phase 1 and phase 2 circuits 12 and 14, respectively; or (4) a static circuit as opposed to a phase-controlled circuit.

The operation of system 10 is understood with reference to the prior art timing diagram of FIG. 1b. Before studying FIG. 1b, however, note that system 10 does not include separate complex latch structures between the output of phase 1 circuit 12 and the input to phase 2 circuit 14; the ability for system 10 to operate despite this lack of additional structure is now explained in connection with FIG. 1b. Turning to FIG. 1b, assume by a time $t_0$ that system 10 is running at a steady-state. At time $t_0$, CLK1 is low and, as a result, phase 1 circuit 12 is in a precharge phase of operation. More specifically with respect to phase 1 circuit 12, the low CLK1 is applied to the gates of p-channel precharge transistor $12_{PT}$ and n-channel discharge transistor $12_{DT}$. In response and due to the conductivity types of these transistors, precharge transistor $12_{PT}$ conducts while discharge transistor $12_{DT}$ does not conduct. The conduction of precharge transistor $12_{PT}$ causes precharge node $12_{PN}$ to rise to $V_{DD}$ and this signal is inverted by output inverter $12_{INV}$, thereby causing the output of phase 1 circuit 12, $12_{OUT}$, to be a logic low at to.

In a similar manner to that just described above with respect to phase 1 circuit 12, phase 2 circuit 14 at $t_0$ is also in a precharge phase of operation. Specifically, at $t_0$, CLK2 is also low, and that low is applied to the gates of p-channel precharge transistor $14_{PT}$ and n-channel discharge transistor $14_{DT}$. In response and due to the conductivity types of these transistors, precharge transistor $14_{PT}$ conducts while discharge transistor $14_{DT}$ does not conduct. The conduction of precharge transistor $14_{PT}$ causes precharge node $14_{PN}$ to rise to $V_{DD}$ and this signal is inverted by output inverter $14_{INV}$, thereby causing the output of phase 2 circuit 14, $14_{OUT}$, to be a logic low at $t_0$.

At time $t_1$, CLK1 begins to rise and, as a result, phase 1 circuit 12 begins to enter its evaluate phase of operation. Specifically, the rising CLK1 is applied to the gates of p-channel precharge transistor $12_{PT}$ and n-channel discharge transistor $12_{DT}$. In response and due to the conductivity types of these transistors, precharge transistor $12_{PT}$ stops conducting while discharge transistor $12_{DT}$ begins to conduct. This phase is referred to as an evaluate phase because at this time, the input(s) to logic circuit $12_L$ are evaluated, that is, if the logic of logic circuit $12_L$ is satisfied, then that status is evaluated in that a conductive path is formed through logic circuit $12_L$; moreover, because discharge transistor $12_{DT}$ is also enabled at this time by the high value of CLK1, then a discharge path is created between precharge node $12_{PN}$ and ground, and in this case, the precharge voltage at precharge node $12_{PN}$ transitions to ground. This transition is inverted by inverter $12_{INV}$ and is shown at time $t_2$ in signal $12_{OUT}$, with the delay between $t_1$ and $t_2$ occurring due to the time of transition of both the transistors in logic circuit $12_L$ as well as those used to form inverter $12_{INV}$.

At time $t_3$, CLK2 begins to rise and, as a result, phase 2 circuit 14 begins to enter its evaluate phase of operation. The rising CLK2 is applied to the gates of p-channel precharge transistor $14_{PT}$ and n-channel discharge transistor $14_{DT}$. In response and due to the conductivity types of these transistors, precharge transistor $14_{PT}$ stops conducting while discharge transistor $14_{DT}$ begins to conduct. At this point, if the logic of logic circuit $14_L$ is satisfied, then that status is evaluated in that a conductive path is formed through logic circuit $14_L$; further, because discharge transistor $14_{DT}$ is also enabled at this time by the high value of CLK2, then a discharge path is created between precharge node $14_{PN}$ and ground, thereby causing the precharge voltage at precharge node $14_{PN}$ to transition to ground. To illustrate the preceding by way of example in FIG. 1b, output $12_{OUT}$ from phase 1 circuit 12 is high at time $t_3$ (i.e., meaning a conductive path is formed through logic circuit $12_L$), and it is further assumed that this asserted signal, along with possibly other signal inputs to logic circuit $14_L$ of phase 2 circuit 14 (such signals not shown), enable a conductive path through logic circuit $14_L$. Thus, following a delay from time $t_3$ to time $t_4$ due to the time of transition of the transistors in logic circuit $14_L$ as well as those used to form inverter $14_{INV}$, output $14_{OUT}$ begins to rise.

At time $t_5$, CLK1 transitions low, thereby ending the evaluate phase for phase 1 circuit 12 and switching it to its next precharge phase. In other words, the falling edge of CLK1 begins to enable precharge transistor $12_{PT}$ (and disables discharge transistor $12_{DT}$), thereby pulling precharge node $12_{PN}$ back to a high voltage, which is inverted and thus after that inversion delay output $12_{OUT}$ is low shortly after time $t_6$. Note, therefore, that as of time $t_6$, the previously valid asserted value of $12_{OUT}$ to phase 2 circuit 14 is no longer valid. Thus, a window of time has been defined between $t_3$, the time at which phase 2 circuit 14 begins its evaluate phase, and $t_6$, the final time at which valid data is provided to phase 2 circuit 14 by phase 1 circuit 12, and during this time window phase 2 circuit 14 must evaluate; in other words, if phase 2 circuit 14 does not evaluate by $t_6$, then it is too late for it to do so. This window of overlapping time, during which a subsequent stage may evaluate, is referred to as the "hold time" for system 10 and, thus, is necessarily designed into system 10 so that each stage may trigger appropriately. Lastly, because after $t_6$ passes there is no longer an asserted signal at output $12_{OUT}$, then logic circuit $14_L$ is no longer enabled. Accordingly, without additional circuitry, the voltage previously discharged from precharge node $14_{PN}$ prior to time $t_6$ may begin to rise since it would be floating; to avoid this possibility, n-channel keeper transistor $14_{KN}$ is included in system 10. Specifically, the low voltage at precharge node $14_{PN}$ is inverted by inverter $14_{INV}$, thereby providing a high signal at output $14_{OUT}$ and, thus, also to the gate of n-channel keeper transistor $14_{KN}$. As a result, n-channel keeper transistor $14_{KN}$ is enabled, thereby connecting precharge node $14_{PN}$ through that transistor to ground.

Completing the entire first cycle of operation of system 10 illustrated by FIG. 1b, at time $t_7$, CLK2 begins to fall, thereby placing phase 2 circuit 14 in its precharge phase; again, this occurs because precharge transistor $14_{PT}$ is enabled by the falling CLK2 and discharge transistor $14_{DT}$ is disabled. In response to the precharging operation, and after two gate delays, output $14_{OUT}$ provided by inverter $14_{INV}$ also begins to fall, as shown at time $t_8$.

Having described a complete cycle of operation of system 10, the remainder of FIG. 1b is directed to a second cycle of operation for system 10. However, by way of a different example, the second cycle illustrated in FIG. 1b differs from the first in that in the second cycle one or more inputs to system 10 prevent it from triggering during its evaluate phases, thereby giving rise to a current leakage issue that is addressed by the preferred embodiments described later. Specifically, at time $t_9$, CLK1 rises and, in the same manner as at time $t_1$, it causes phase 1 circuit 12 to begin its evaluate phase. In this example, assume that the INPUTS to logic circuit $12_L$ are such that no conductive path is formed through it; as a result, following time $t_9$, precharge node $12_{PN}$ remains precharged and, hence, output $12_{OUT}$ remains low. In addition, this low enables p-channel keeper transistor $12_{KP}$ which thereby couples $V_{DD}$ to precharge node $12_{PN}$ to further maintain the precharge voltage. Next, at time $t_{10}$, phase 2 circuit 14 enters its evaluate phase. According to the present example, the low at output $12_{OUT}$ is therefore connected to logic circuit $14_L$ and, as a result, no conductive path is formed through logic circuit $14_L$. Consequently, following time $t_{10}$, output $14_{OUT}$ also remains low. In addition, this low at output $14_{OUT}$ enables p-channel keeper transistor $14_{KP}$ which thereby couples $V_{DD}$ to precharge node $14_{PN}$ to further maintain the precharge voltage.

To conclude the introduction to the preferred embodiments, additional observations are now made with respect to the second cycle of operation of system 10 illustrated by FIG. 1b. Particularly, as of time $t_{10}$, discharge transistor $14_{DT}$ is enabled, but there is no conductive path through logic circuit $14_L$ because output $12_{OUT}$ is low. However, recall also that logic circuit $14_L$ is likely to include LVT transistors and, as such, when not enabled, each such transistor will provide a greater amount of leakage current as compared to a high threshold voltage ("HVT") transistor. Note further that as of time $t_{10}$, when this leakage is occurring, the high voltage at precharge node $14_{PN}$ is potentially maintained as a high voltage through the operation of p-channel keeper transistor $14_{KP}$. Specifically, the high precharge voltage is inverted by inverter $14_{INV}$ and, thus, a low is applied to the gate of p-channel keeper transistor $14_{KP}$ thereby enabling that transistor. In response, the enabled p-channel keeper transistor $14_{KP}$ connects $V_{DD}$ at its source to precharge node $14_{PN}$ at its drain. In other words, the HVT p-channel keeper transistor $14_{KP}$ attempts to offset the leakage of the LVT transistor(s) in logic circuit $14_L$. While this operation has been implemented in the past, the leakage drain on precharge node $14_{PN}$ may be so large that the HVT p-channel keeper transistor $14_{KP}$ may be insufficient to fight it, and the voltage on the node may degrade unacceptably or suffer from very low noise margin. As discussed in the previous Background Of The Invention section of this document, these issues may be particularly emphasized as various factors decrease the strength of the p-channel keeper transistor $14_{KP}$ in comparison to the leakage of the LVT n-channel transistor(s) in logic circuit $14_L$. As such, the preferred embodiments described below attempt to reduce such drawbacks and thereby improve upon the prior art.

Figure 2:
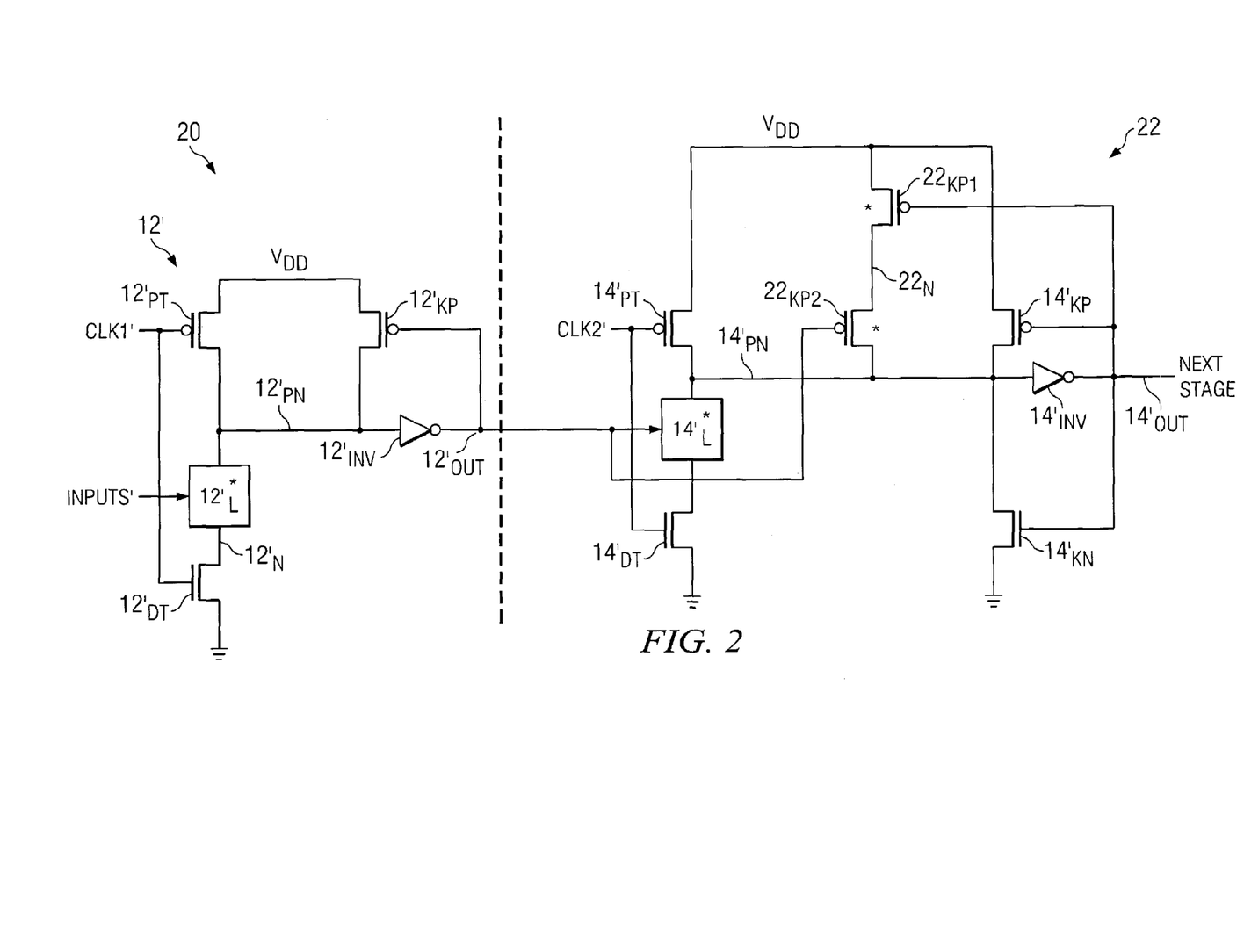
FIG. 2 illustrates a schematic of a first inventive hold time latch.

FIG. 2 illustrates a schematic of a first inventive hold time latch system designated generally at 20. System 20 in certain respects resembles system 10 of FIG. 1a, above; thus, for common aspects, the reference numerals from FIG. 1a are carried forward into FIG. 2 with the addition of an apostrophe in order to avoid confusion when discussing elements in FIG. 2. For example, therefore, system 20 includes a phase 1 circuit 12' which alone is the same as phase 1 circuit 12 of FIG. 1a. However, the second phase circuit in system 20 differs in certain respects than that from FIG. 1a and, thus, it is referenced as phase 2 circuit 22. Looking to the remaining differences in phase 2 circuit 22 as compared to phase 2 circuit 14 of FIG. 1a, phase 2 circuit 22 includes a first LVT p-channel keeper transistor $22_{KP1}$ having its source connected to $V_{DD}$, its gate connected to output $14'_{OUT}$ from inverter $14'_{INV}$, and its drain connected to a node $22_N$. Further, phase 2 circuit 22 includes a second LVT p-channel keeper transistor $22_{KP2}$ having its source connected to node $22_N$, its gate connected to output $12'_{OUT}$ from phase 1 circuit 12', and its drain connected to precharge node $14'_{PN}$. Each of p-channel transistors $22_{KP1}$ and $22_{KP2}$ is preferably a LVT transistor, where such a preference is also shown in FIG. 2 by the use of an asterisk next to each device to indicate its LVT characteristic. Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. Thus, within this document, a transistor of the first type is referred to as an HVT transistor (i.e., a transistor with a relatively high $V_T$) while a transistor of the second type is referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current than an HVT transistor. Indeed, the typical leaking by an LVT transistor may be greater than that of an HVT transistor by two orders of magnitude or more. Lastly, since LVT and HVT have been shown as relative terms, note in FIG. 2 that each of p-channel transistors $22_{KP1}$ and $22_{KP2}$, as LVT transistors, preferably has a lower $V_T$ as compared to at least one other p-channel transistor in system 20, such as in comparison to p-channel transistor $14'_{KP}$ or in comparison to the p-channel transistor which will be understood by one skilled in the art to be included in inverter $14'_{INV}$. Lastly, in FIG. 2, phase 1 circuit 12' is controlled by a clock signal CLK1' and phase 2 circuit 22 is controlled by a clock signal CLK2'; as known in the art these signals may be provided by a single clock by inverting that clock in one phase circuit relative to the other, or separate clock signals may be used.

The operation of system 20 is now described, and the following demonstrates that the inclusion of p-channel keeper transistors $22_{KP1}$ and $22_{KP2}$ provides additional protection against voltage being lost at precharge node $14'_{PN}$, where such protection is provided in that these LVT transistors provide additional drive current to that node to offset the current leakage by any one or more LVT transistors in logic circuit $14'_L$, thereby operating to maintain the precharge voltage at precharge node $14'_{PN}$. In addition, however, the inclusion of these devices is such that preferably the hold time operation of the device is not disturbed, that is, phase 2 circuit 22 is still able to evaluate during the time between the beginning of its evaluate phase (i.e., when CLK2' rises) and the completion of the presentation of valid data from phase 1 circuit 12'. These attributes and benefits are further explored below in connection with the two possible instances of data passing through phase 2 circuit 22, wherein in a first instance the input data provided by output $12_{OUT}$ is low as described in connection with FIG. 3, and wherein in a second instance the input data provided by output $12'_{OUT}$ is high as described in connection with FIG. 4.

Figure 3:
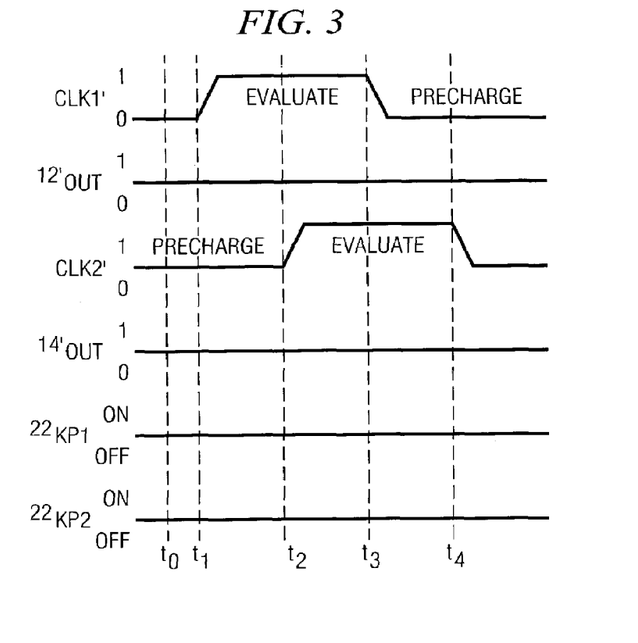
FIG. 3 illustrates a timing diagram of various signals in connection with the system of FIG. 2 and for an example where phase 1 circuit 12' provides a low output in its evaluate phase.

FIG. 3 illustrates a timing diagram of various signals in connection with system 20 and for an example where phase 1 circuit 12' provides a low output, $12'_{OUT}$, in its evaluate phase to phase 2 circuit 22. As of time $t_0$, both phase 1 circuit 12' and phase 2 circuit 14' are in respective precharge phases of operation, where the previous discussion with respect to phase 1 circuit 12 should provide an understanding to one skilled in the art that as a result phase 1 circuit 12' similarly provides a low output, $12'_{OUT}$. Looking to phase 2 circuit 22, the low output $12_{OUT}$ enables its p-channel precharge transistor $14'_{PT}$, but in addition the low signal at $12_{OUT}$ is connected to the gate of p-channel keeper transistor $22_{KP2}$. Also, the high signal at precharge node $14'_{PN}$ is inverted by inverter $14'_{INV}$, which thereby provides a low signal output, $14'_{OUT}$, to the gate of p-channel keeper transistor $22_{KP1}$. As a result, as shown in the bottom two signals of FIG. 3, as of time $t_0$, both p-channel keeper transistors $22_{KP1}$ and $22_{KP2}$ are enabled (i.e., shown as "ON" in FIG. 3).

Continuing with FIG. 3, at time $t_1$, CLK1' rises, thereby putting phase 1 circuit 12' into its evaluate phase. In the present example of FIG. 3, it is assumed however that phase 1 circuit 12' continues to provide a low output, $12'_{OUT}$, that is, as would occur when the INPUTS' to logic circuit $12'_L$ are not enabling, that is, such that a conductive path is not formed through that circuit. Thus, immediately following $t_1$, output $12'_{OUT}$ remains low. In addition, as of $t_1$, CLK2' is low and thus, immediately following $t_1$ phase 2 circuit 22 continues in its precharge phase. Accordingly, as described above as occurring at $t_0$, all three p-channel transistors $14'_{KP}$, $22_{KP1}$ and $22_{KP2}$ remain enabled and thereby couple $V_{DD}$ to precharge node $14'_{PN}$.

Continuing with FIG. 3, at time $t_2$, CLK2' transitions high, thereby placing phase 2 circuit 22 in its evaluate phase. In the present example, recall that output $12'_{OUT}$ is low (i.e., non-enabling to n-channel transistors) and, thus, no conductive path is formed through logic circuit $14'_L$ of phase 2 circuit 22. Thus, during the phase 2 circuit 22 evaluate phase, precharge node 14'$_{PN}$ is not discharged. However, also during this evaluate phase, the high CLK2' enables n-channel discharge transistor 14'$_{DT}$, connected to logic circuit 14'$_L$. Thus, any LVT n-channel transistor in logic circuit 14'$_L$ has the opportunity to leak current through that enabled n-channel discharge transistor 14'$_{DT}$. However, at the same time that such leakage may occur and thereby draw down the voltage at precharge node 14'$_{PN}$, both p-channel keeper transistors 22$_{KP1}$ and 22$_{KP2}$ are enabled, the former due to the low voltage at output 14'$_{OUT}$ and the latter due to the low voltage at the output 12'$_{OUT}$ from phase 1 circuit 12'. Thus, these keeper transistors supply current to precharge node 14'$_{PN}$ to thereby offset any leakage that may be occurring via logic circuit 14'$_L$ and thereby maintain the precharge voltage at precharge node 14'$_{PN}$.

Continuing with FIG. 3, at time t$_3$, CLK1' transitions low and, thus, phase 1 circuit 12' switches to its precharge phase, that is, its precharge transistor 12'$_{PT}$ is enabled to couple V$_{DD}$ to its precharge node 12'$_{PN}$ and discharge transistor 14'$_{DT}$ is disabled. However, in the present example, output 12'$_{OUT}$ was low prior to t$_3$ and, thus, it continues to be low after t$_3$. Also at t$_3$, phase 2 circuit 22 remains in its evaluate phase, and during the remainder of that phase the low output 12'$_{OUT}$ continues to provide an enabling signal to the gate of p-channel keeper transistor 22$_{KP2}$. At the same, the low output 12'$_{OUT}$ has prevented logic circuit 14$_L$ from conducting and, thus, the precharge voltage remains at precharge node 14'$_{PN}$, which thereby causes output 14'$_{OUT}$ to continue to provide a low signal. This low output, 14'$_{OUT}$, enables p-channel keeper transistor 22$_{KP1}$ and, thus, its source/drain path, in series with the source/drain path of enabled p-channel keeper transistor 22$_{KP2}$, continues to couple V$_{DD}$ to precharge node 14'$_{PN}$, thereby offsetting any leakage caused by any LVT transistor in logic circuit 14'$_L$.

Continuing with FIG. 3, at time t$_4$, CLK2' transitions low, thereby ending the evaluate phase of phase 2 circuit 22 and, thus, beginning once more its precharge phase. The falling CLK2' enables precharge transistor 14'$_{PT}$, thereby precharging precharge node 14'$_{PN}$ to V$_{DD}$. The falling CLK2' also disables discharge transistor 14'$_{DT}$ and, thus, its HVT characteristic prevents leakage through the discharge path from precharge node 14'$_{PN}$ to ground, regardless of the state of the transistor(s) in logic circuit 14'$_L$. As discussed above, also at this time, phase 2 circuit 22 remains precharged.

Figure 4:
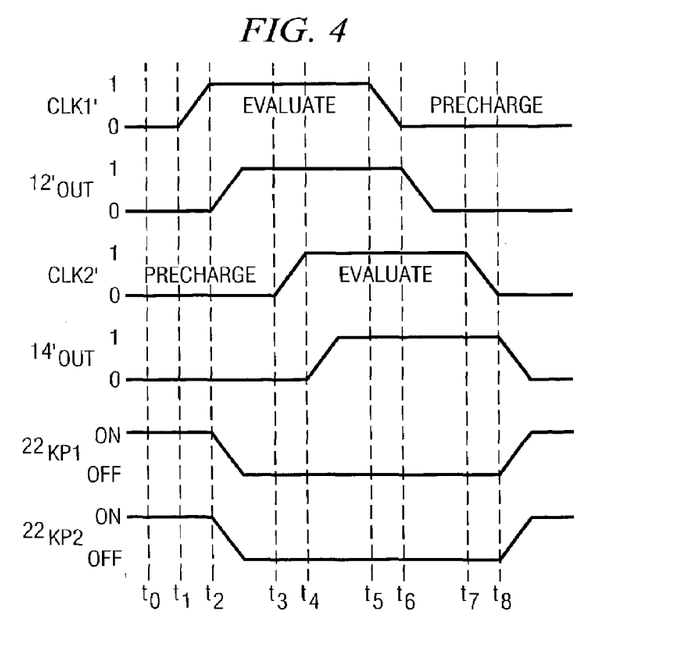
FIG. 4 illustrates a timing diagram of various signals in connection with the system of FIG. 2 and for an example where phase 1 circuit 12' provides a high output in its evaluate phase.

FIG. 4 illustrates a timing diagram of various signals in connection with system 20 of FIG. 2 and for an example where phase 1 circuit 12' provides a high output, 12'$_{OUT}$, in its evaluate phase to phase 2 circuit 22, that is, an output that is enabling to n-channel transistors. As of time t$_0$, both phase 1 circuit 12' and phase 2 circuit 14' are in respective precharge phases of operation. Thus, as described earlier, phase 1 circuit 12 provides a low output, 12'$_{OUT}$, and as shown in the bottom two signals of FIG. 3, both p-channel keeper transistors 22$_{KP1}$ and 22$_{KP2}$ are enabled (i.e., shown as "ON" in FIG. 4).

Continuing with FIG. 4, at time t$_1$, CLK1' rises, thereby putting phase 1 circuit 12' into its evaluate phase. In the present example of FIG. 4, it is assumed however that phase 1 circuit 12' in response transitions to then provide a high output, 12'$_{OUT}$, which is shown as occurring at time t$_2$, due to a delay in the time it takes the transition in the phase 1 logic circuit 12'$_L$ to conduct as well as the response of its inverter 12'$_{INV}$. In addition, as of time t$_1$, CLK2' is low and thus, immediately following t$_1$ phase 2 circuit 22 continues in its precharge phase. Accordingly, as described above as occurring at t$_0$, all three p-channel keeper transistors 14'$_{KP}$, 22$_{KP1}$, and 22$_{KP2}$ remain enabled and thereby couple V$_{DD}$ to precharge node 14'$_{PN}$.

Continuing with FIG. 4, at time t$_3$, CLK2' transitions high, thereby placing phase 2 circuit 22 in its evaluate phase. In the present example, recall that 12'$_{OUT}$ is high at this time and, thus, it enables a conductive path through logic circuit 14'$_L$ of phase 2 circuit 22. Thus, during the phase 2 circuit 22 evaluate phase, precharge node 14'$_{PN}$ is discharged through the discharge path that includes a conductive path through logic circuit 14'$_L$ and discharge transistor 14'$_{DT}$. As a result, following a delay for the discharge path to become sufficiently enabled and the operation of inverter 14'$_{INV}$, by time t$_4$ output 14'$_{OUT}$ begins to rise in response to the discharge of precharge node 14'$_{PN}$. At the same time, the high output 12'$_{OUT}$ is connected to the gate of p-channel keeper transistor 22$_{KP2}$, thereby disabling that transistor; as a result, the previous current source provided through p-channel keeper transistor 22$_{KP2}$ (and transistor 22$_{KP1}$) is effectively shut off as of this time, thereby permitting the proper discharge of precharge node 14'$_{PN}$ due to the discharge path through logic circuit 14'$_L$ and discharge transistor 14'$_{DT}$. In other words, at this time, which occurs during the hold time of the latch of system 20, proper operation is ensured while the additional current leakage protection afforded by p-channel keeper transistors 22$_{KP1}$ and 22$_{KP2}$ is available at other times.

Continuing with FIG. 4, at time t$_5$, CLK1' transitions low, thereby returning phase 1 circuit 12' to its precharge phase. As a result, following a delay due to inverter 12'$_{INV}$, by time t$_6$ output 12'$_{OUT}$ begins to fall in response to the charging of precharge node 12'$_{PN}$ to V$_{DD}$. At the same time, the high output 14'$_{OUT}$ remains the same, thereby continuing to disable p-channel keeper transistor 22$_{KP1}$. Thus, at this time, there is no change to the discharged state of precharge node 14'$_{PN}$ and output 14'$_{OUT}$ remains high.

Completing FIG. 4, at time t$_7$, CLK2' transitions low, thereby returning phase 2 circuit 22 to its precharge phase. As a result, following a delay due to enabling precharge transistor 14'$_{PT}$ as well as the operation of inverter 14'$_{INV}$, by time t$_8$ output 14'$_{OUT}$ begins to fall in response to the charging of precharge node 14'$_{PN}$ to V$_{DD}$. At time t$_7$, output 12'$_{OUT}$ from phase 1 circuit 12' already was low since that circuit is in its precharge phase, and shortly following time t$_7$ at a time t$_8$, output 14'$_{OUT}$ from phase 2 circuit 14' falls low as it enters its precharge phase. Thus, after t$_8$, again both p-channel keeper transistors 22$_{KP1}$, and 22$_{KP2}$ are enabled, thereby also coupling V$_{DD}$ to precharge node 14'$_{PN}$.

From the preceding, one skilled in the art should appreciate that system 20 provides various benefits over the prior art. First, in the instance where a first phase of a hold time latch provides a low output (i.e., non-enabling to the second phase circuit discharge path), then the voltage drop due to LVT transistor leakage that might otherwise occur in the discharge path of the second phase circuit is reduced if not eliminated due to the inclusion of LVT transistor current sourcing to the second phase precharge node. Second, in the instance where the first phase circuit of a hold time latch provides a high output (i.e., enabling to the second phase circuit discharge path), then the LVT transistor current source in the second phase circuit is disabled and, thus, does not disturb the ability of the second phase circuit to properly discharge during its evaluate phase. Lastly and as shown below through examples of additional embodiments, the preceding principles may be extended to alternative hold time latches while providing the preceding benefits and indeed extending them in certain instances.

Figure 5:
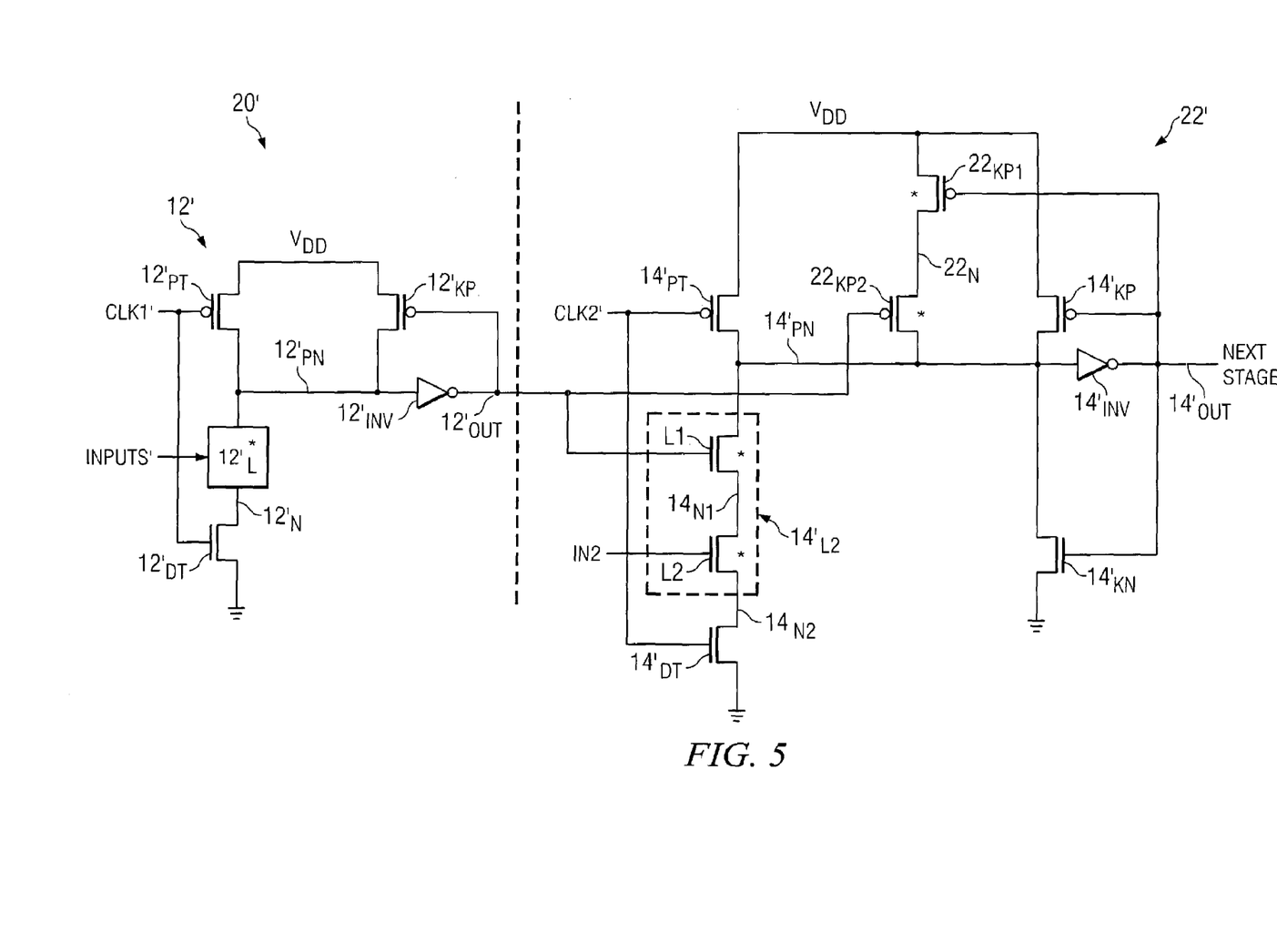
FIG. 5 illustrates a schematic of an alternative inventive hold time latch system, where an additional series transistor is shown in the second phase circuit discharge path.

FIG. 5 illustrates a schematic of an alternative inventive hold time latch system designated generally at 20'. System 20' in certain respects resembles system 20 of FIG. 2, above; thus, for common aspects, the reference numerals from FIG. 2 are carried forward into FIG. 5. The only difference between systems 20 and 20' is that the latter includes an elaboration of one type of circuit that may be included in what was referred to as logic circuit $14'_L$ in FIG. 2, where such a circuit is for sake of distinction shown as logic circuit $14'_{L2}$ in FIG. 5 and the second phase circuit is shown as phase 2 circuit 22'. As detailed below, the additional illustration provided by FIG. 5 demonstrates that the inclusion of p-channel keeper transistors $22_{KP1}$ and $22_{KP2}$ may provide additional current sourcing immediately after the hold time in cases when phase 2 circuit 22' did not change state in the preceding evaluate phase.

Looking to logic circuit $14'_{L2}$ in detail, it includes two LVT n-channel transistors L1 and L2 with their source/drain paths connected in series. More particularly, transistor L1 has its drain connected to precharge node $14'_{PN}$ and its source connected to a node $14_{N1}$, and transistor L2 has its drain connected to node $14_{N1}$ and its source connected to a node $14_{N2}$. Node $14_{N2}$ is also connected to the drain of n-channel discharge transistor $14'_{DT}$, which has its source connected to ground and its gate connected to CLK2'. The gate of transistor L1 is connected to receive the output, $12'_{OUT}$, from phase 1 circuit 12, in accordance with the general proposition stated earlier that output $12'_{OUT}$ controls, at least in part, whether a discharge path is enabled in the second phase circuit 22' from its precharge node $14'_{PN}$ to ground. In other words, one skilled in the art will appreciate that for such a discharge path to occur, output $12'_{OUT}$ must be asserted to enable a transistor in the discharge path of second phase circuit 22'; in addition, however, due to the additional transistor L2 with its source/drain path connected in series with the source/drain path of transistor L1, then for such a discharge path to occur, transistor L2 also must be enabled during an overlapping period. In this regard, the gate of transistor L2 is connected to an input IN2, which is intended to be independent of the output of phase 1 circuit 12' and thus may come from another source (either static or dynamic). Lastly, and as understood given the various previous examples, also to complete such a discharge path, CLK2' must at an overlapping time be asserted to enable discharge transistor $14'_{DT}$. These aspects are explored still further, below.

Figure 6:
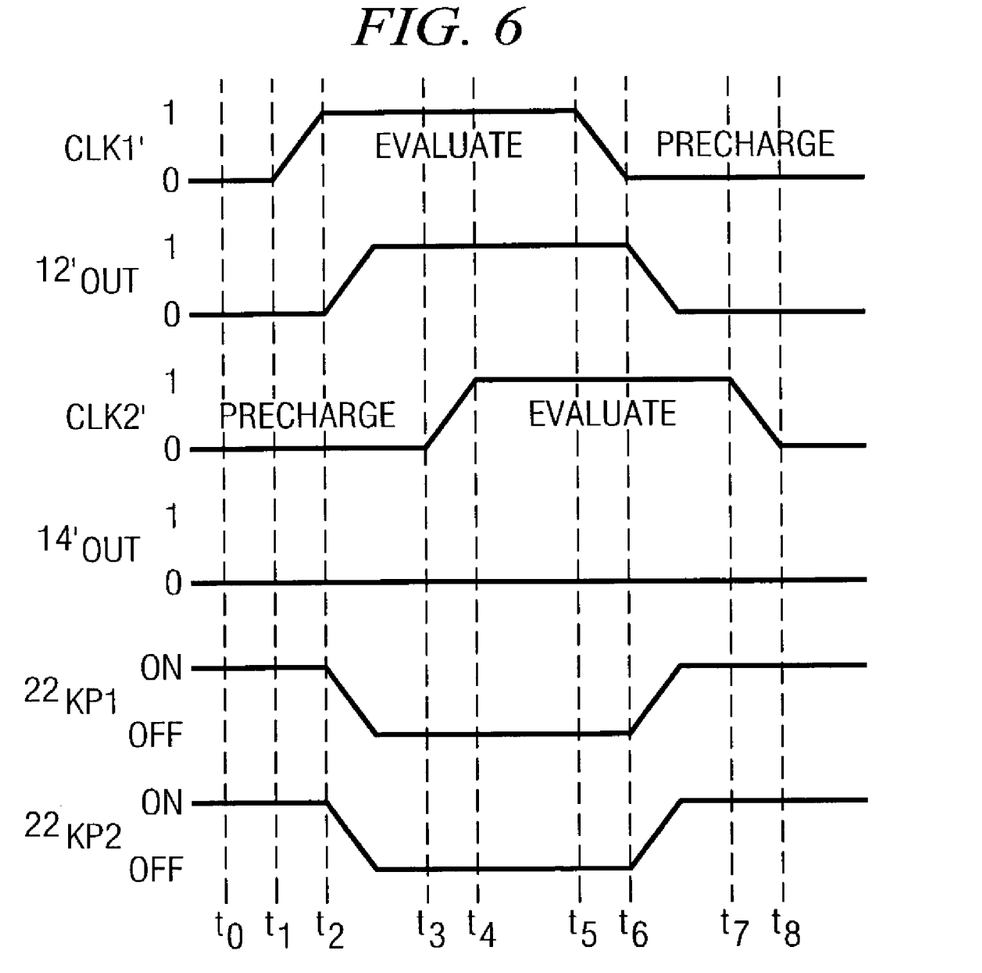
FIG. 6 illustrates a timing diagram of various signals in connection with the system of FIG. 5 and for an example where its phase 1 circuit 12' provides a high output in its evaluate phase, but where the output $14'_{OUT}$ of phase 2 circuit 22' remains high due to the addition of a low input signal IN2.

The operation of system 20' is in various instances comparable to that described above with respect to system 20. Specifically, in the case when IN2 is high, then the remaining operation of system 20' is the same as described for system 20 in FIGS. 3 and 4. However, when IN2 is low, then an additional observation may be made and is now explored with reference to the timing diagram of FIG. 6. Particularly, FIG. 6 illustrates a timing diagram that from time $t_0$ to time $t_3$ is the same as in FIG. 4 described above and, thus, the reader is referred to the earlier discussion of FIG. 4 to appreciate the operation of system 20' up to $t_3$. At time $t_3$, CL2' transitions high, thereby placing phase 2 circuit 22' into its evaluate phase. However, unlike FIG. 4, in FIG. 6, output $14'_{OUT}$ remains low notwithstanding the high input to n-channel transistor L1 because at that same time IN2 is low, thereby disabling the LVT n-channel transistor L2. Accordingly, at this time, current leakage occurs from precharge node $14'_{PN}$ to ground. Continuing, at time $t_5$, CLK1' transitions low, thereby precharging phase 1 circuit 12' and causing output $12'_{OUT}$ to transition low after a delay as shown at time $t_6$. For system 20', therefore, as output $12'_{OUT}$ falls, it enables p-channel keeper transistor $22_{KP2}$ while at the same time the already-low output $14'_{OUT}$ enables p-channel keeper transistor $22_{KP1}$. Accordingly, also following $t_6$, those enabled LVT p-channel keeper transistors once again couple $V_{DD}$ to precharge node $14_{PN}$, thereby offsetting leakage current and voltage falling due to the leakage of the LVT transistors in logic circuit $14'_{L2}$. From the preceding, therefore, one skilled in the art should recognize that system 20' and FIG. 6 provide an instance where the first phase of a hold time latch provides a high output that again is used during the beginning of the evaluate phase of the phase 2 circuit 22' to disable the LVT transistor current source by directly connecting that high signal to a p-channel keeper transistor; however, as soon as that high output returns to a low signal due to the return of phase 1 circuit 12' to its precharge phase and thus, during the remainder of the duration of the evaluate phase of phase 2 circuit 22', the LVT p-channel transistor current source is enabled to offset any discharge path current leakage occurring during that time and thereby maintain the precharge voltage.

Figure 7:
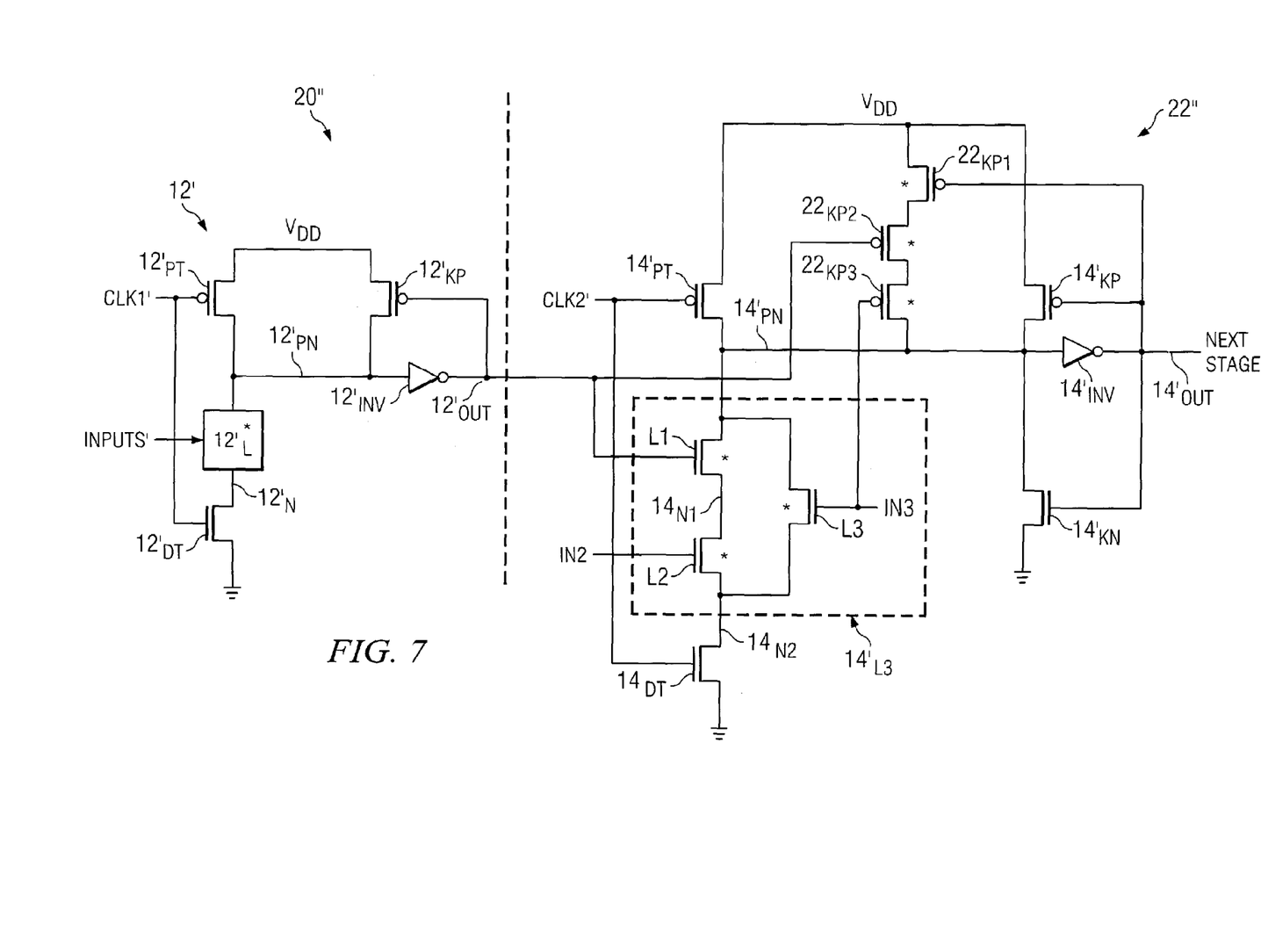
FIG. 7 illustrates a schematic of an alternative inventive hold time latch system, where an additional parallel transistor L3 is shown in the second phase circuit discharge path as well as an additional series transistor $22_{KP3}$ in the LVT current source path to precharge node $14'_{PN}$.

FIG. 7 illustrates a schematic of another alternative inventive hold time latch system designated generally at 20". System 20" in certain respects resembles system 20' of FIG. 5, above, and again for common aspects the reference numerals from FIG. 5 are carried forward into FIG. 7. The differences between systems 20' and 20" are that the latter includes an additional LVT p-channel keeper transistor and additional circuitry within what was referred to as logic circuit $14'_{L2}$ in FIG. 5, where such a circuit is reference for sake of distinction as logic circuit $14'_{L3}$ in FIG. 7. As detailed below, the additional illustration provided by FIG. 7 demonstrates that the inclusion of yet another p-channel keeper transistor $22_{KP3}$ can provide additional current sourcing to precharge node $14'_{PN}$ at certain times while disabling that current sourcing at other times. Looking more particularly to the added circuitry of system 20", p-channel keeper transistor $22_{KP3}$ is connected between what was the drain-to-precharge node connection of p-channel keeper transistor $22_{KP2}$ in FIG. 5; thus, the source of p-channel keeper transistor $22_{KP3}$ is connected to the drain of p-channel keeper transistor $22_{KP2}$, and the drain of p-channel keeper transistor $22_{KP3}$ is connected to precharge node $14'_{PN}$. The gate of p-channel keeper transistor $22_{KP3}$ is connected to receive an input signal, IN3, which is further connected to the gate of an LVT n-channel transistor L3 in logic circuit $14'_{L3}$. The source of n-channel transistor L3 is connected to node $14_{N2}$ and the drain of n-channel transistor L3 is connected to precharge node $14'_{PN}$.

By way of introduction to the operation of system 20", note that logic circuit $14'_{L3}$ provides two different discharge paths between precharge node $14'_{PN}$ and node $14_{N2}$. The first of these two discharge paths is the same as that of system 20', and therefore consists of n-channel transistors L1 and L2. The second of these discharge paths, in the illustrated example, consists solely of n-channel transistor L3, although transistor L3 could be replaced with a more general representation of another logic circuit that includes any number of transistors (preferably n-channel transistors). In the illustrated example, both of the discharge paths are connected to discharge transistor $14_{DT}$ and, thus, when discharge transistor $14_{DT}$ is enabled, then either or both of these paths can conduct to cause precharge node $14'_{PN}$ to discharge to ground.

The operation of system 20" in certain respects is now described in additional detail, while this operation as well as the remaining operation may be appreciated further by one skilled in the art given the comparable nature to various embodiments described above. Thus, looking to the differences provided by system 20″, during the evaluate phase of phase 2 circuit 22″, precharge node 14′$_{PN}$ will discharge if at least IN3 or IN2 (when I2 is combined with a high output from 12′$_{OUT}$) is asserted high. Further, if either of these two signals IN3 or IN2 is asserted high, then that asserted high signal also disables the respective p-channel keeper transistor 22$_{KP3}$ or 22$_{KP2}$ to which it is connected. Thus, at the same time that precharge node 14′$_{PN}$ is being discharged, there is an open circuit in the path from $V_{DD}$, via a LVT p-channel transistor source, to precharge node 14′$_{PN}$. Conversely, if neither IN3 nor IN2 is asserted high, that is, both are low, during the evaluate phase of phase 2 circuit 22″, then each such signal enables the respective p-channel keeper transistor 22$_{KP3}$ or 22$_{KP2}$ to which it is connected. Accordingly, during this time, the entire LVT p-channel transistor source, consisting of p-channel keeper transistors 22$_{KP1}$, 22$_{KP2}$, and 22$_{KP3}$, is enabled, thereby providing current to precharge node 14′$_{PN}$ to thereby offset leakage through a discharge path as resulting from logic circuit 14′$_{L3}$ and to maintain the precharge voltage at precharge node 14′$_{PN}$.

Given the additional devices and operation of system 20″, one skilled in the art may appreciate that the inventive teachings can be expanded to a hold time latch that has multiple potential discharge paths between its precharge node and a low reference voltage such as ground. The extension is provided by including at least one p-channel transistor, for each potential discharge path, in the LVT p-channel transistor current source path from $V_{DD}$ to the precharge node. By expanding the inventive applications in this manner, there is still ensured the aspect that, during the evaluate phase of the second phase circuit, when any discharge path from the precharge node to ground is enabled, the LVT p-channel transistor source is disabled, and when all discharge paths from the precharge node to ground are disabled, the LVT p-channel transistor source is enabled, thereby offsetting current leakage in the discharge path. Note that this aspect of including an additional discharge path and an additional corresponding p-channel transistor in the LVT current source path can be further expanded, although beyond three series source devices there may be practical considerations of whether it is desirable to further provide such devices as there may be a motivation to not include too many series devices in the feedback network.

From the above, it may be appreciated that the above embodiments provide an improved hold time latch over that provided by the prior art. The preceding has demonstrated that the improvements include the provision of additional source current to the hold time latch second phase precharge node, where the second phase circuit may then employ LVT n-channel devices in its discharge path to benefit from the speed of those devices when enabled during its evaluate phase, yet any additional leakage provided by those devices when not enabled during the evaluate phase can be offset by the additional current source. Further, in the preferred embodiments, the additional current source implements LVT p-channel devices. Still further, the above functionality is provided while still permitting the second phase circuit of the hold time latch an adequate time to change states, in those instances where a change of state is triggered by an appropriate one or more inputs. Thereafter, the LVT p-channel transistor source can be enabled, thereby guarding against leakage and noise. Moreover, this functionality is provided without any additional clocks. Lastly, note that while the present embodiments have been described in detail, various substitutions, modifications or alterations could be made to the descriptions set forth above without departing from the inventive scope which is defined by the following claims.

What is claimed is:

1. A dynamic logic hold time latch, comprising:
   a first phase circuit operable in a precharge phase and an evaluate phase, wherein the first phase circuit comprises:
   a precharge node to be precharged to a precharge voltage during the precharge phase of the first phase circuit and operable to be discharged during the evaluate phase of the first phase circuit; and
   an output for providing a signal in response to a state at the precharge node of the first phase circuit; and
   a second phase circuit operable in a precharge phase and an evaluate phase, wherein the precharge phase and the evaluate phase of the second phase circuit are out of phase with respect to the precharge phase and the evaluate phase of the first phase circuit, and wherein the second phase circuit comprises:
   a precharge node to be precharged to the precharge voltage during the precharge phase of the second phase circuit and operable to be discharged during the evaluate phase of the second phase circuit;
   a conditional discharge path connected to the precharge node of the second phase circuit and operable, during the evaluate phase of the second phase circuit and in response at least in part to the output of the first phase circuit, to conditionally couple the precharge node of the second phase circuit to a voltage different than the precharge voltage;
   voltage maintaining circuitry, coupled to receive the output of the first phase circuit, for coupling the precharge voltage to the precharge node of the second phase circuit during the evaluate phase of the second phase circuit in response to the output of the first phase circuit providing a first value; and
   wherein the first value consists of a value that is disabling to at least one switching device in the conditional discharge path of the second phase circuit.

2. The hold time latch of claim 1 wherein the voltage maintaining circuitry comprises a low threshold voltage transistor having a conductivity type and a first threshold voltage, wherein the first threshold voltage is lower than a threshold voltage of another transistor in the hold time latch having a same conductivity type.

3. The hold time latch of claim 1 wherein the voltage maintaining circuitry comprises a low threshold voltage p-channel transistor having a first threshold voltage, wherein the first threshold voltage is lower than a threshold voltage of another p-channel transistor in the hold time latch.

4. The hold time latch of claim 3 wherein the second phase circuit further comprises an inverter connected to the precharge node of the second phase circuit and having an inverter output, the inverter comprising a high threshold voltage p-channel transistor having a second threshold voltage greater than the first threshold voltage.

5. The hold time latch of claim 3 wherein the second phase circuit further comprises:
   an inverter connected to the precharge node of the second phase circuit and having an inverter output; and
   a high threshold voltage p-channel transistor having a source connected to receive the precharge voltage, a drain connected to the precharge node of the second phase circuit, and a gate connected to the inverter output, wherein the high threshold voltage p-channel transistor has a second threshold voltage greater than the first threshold voltage.

6. The hold time latch of claim 1:
wherein the at least one switching device comprises an n-channel transistor comprising a gate connected to the output; and
wherein the first value comprises a logical low signal.

7. The hold time latch of claim 6 wherein the n-channel transistor has a threshold voltage that is lower than a threshold voltage of another n-channel transistor in the hold time latch.

8. The hold time latch of claim 1 wherein, responsive to the first value, the voltage maintaining circuitry couples the precharge voltage to the precharge node of the second phase circuit during an entirety of the evaluate phase of the second phase circuit.

9. The hold time latch of claim 8:
wherein the at least one switching device comprises an n-channel transistor comprising a gate connected to the output; and
wherein the first value comprises a logical low signal.

10. The hold time latch of claim 9 wherein the n-channel transistor has a threshold voltage that is lower than a threshold voltage of another n-channel transistor in the hold time latch.

11. The hold time latch of claim 10:
wherein the second phase circuit comprises an inverter connected to the precharge node of the second phase circuit and having an inverter output; and
wherein the voltage maintaining circuitry comprises:
a first p-channel transistor having a source connected to receive the precharge voltage, a drain connected to a node, and a gate connected to the inverter output; and
a second p-channel transistor having a source connected to the node, a drain connected to the precharge node of the second phase circuit, and a gate connected to the output of the first phase circuit.

12. The hold time latch of claim 11 wherein each of the first and second p-channel transistors has a first threshold voltage, wherein the first threshold voltage is lower than a threshold voltage of another p-channel transistor in the hold time latch.

13. The hold time latch of claim 1 wherein the voltage maintaining circuitry further comprises circuitry, coupled to receive the output of the first phase circuit, for precluding a connection of the precharge voltage to the precharge node of the second phase circuit during at least a first portion of the evaluate phase of the second phase circuit in response to the output of the first phase circuit providing a second value that is complementary to the first value.

14. The hold time latch of claim 13:
wherein the conditional discharge path of the second phase circuit comprises a source/drain path of at least one n-channel transistor comprising a gate connected to the output;
wherein the first value comprises a logical low signal; and
wherein the second value comprises a logical high signal.

15. The hold time latch of claim 14 wherein the n-channel transistor has a threshold voltage that is lower than a threshold voltage of another n-channel transistor in the hold time latch.

16. The hold time latch of claim 14 wherein the second value consists of a value that is enabling to the conditional discharge path of the second phase circuit.

17. The hold time latch of claim 16 wherein, responsive to the second value, the circuitry for precluding precludes a connection of the precharge voltage to the precharge node of the second phase circuit during an entirety of evaluate phase of the second phase circuit.

18. The hold time latch of claim 1 wherein the voltage maintaining circuitry further comprises circuitry, coupled to the output of the first phase circuit, for precluding a connection of the precharge voltage to the precharge node of the second phase circuit during only a first portion of the evaluate phase of the second phase circuit in response to the output of the first phase circuit providing, during the first portion of the evaluate phase, a second value that is complementary to the first value.

19. The hold time latch of claim 18:
wherein the second phase circuit further comprises an output for providing a signal in response to a state at the precharge node of the second phase circuit; and
wherein the voltage maintaining circuitry further comprises circuitry, coupled to the output of the second phase circuit, for coupling the precharge voltage to the precharge node of the second phase circuit during a remaining period of the evaluate phase of the second phase circuit, following the first portion of the evaluate phase of the second phase circuit, in response to the output of the second phase circuit providing the first value at a same time that the output of the first phase circuit provides the first value.

20. The hold time latch of claim 19:
wherein the second phase circuit comprises an inverter connected to the precharge node of the second phase circuit and having an inverter output; and
wherein the voltage maintaining circuitry comprises:
a first p-channel transistor having a source connected to receive the precharge voltage, a drain connected to a node, and a gate connected to the inverter output; and
a second p-channel transistor having a source connected to the node, a drain connected to the precharge node of the second phase circuit, and a gate connected to the output of the first phase circuit.

21. The hold time latch of claim 20 wherein each of the first and second p-channel transistors has a first threshold voltage, wherein the first threshold voltage is lower than a threshold voltage of another p-channel transistor in the hold time latch.

22. The hold time latch of claim 1:
wherein the conditional discharge path comprises a first conditional discharge path;
and further comprising a plurality of conditional discharge paths, wherein the plurality of conditional discharge paths comprise the first conditional discharge path;
wherein each conditional discharge path is connected to the precharge node of the second phase circuit and operable, during the evaluate phase of the second phase circuit and in response at least in part to the output of the first phase circuit, to conditionally couple the precharge node of the second phase circuit to the voltage different than the precharge voltage.

23. The hold time latch of claim 22 wherein the voltage maintaining circuitry further comprises circuitry, coupled to receive at least one signal input to each of the plurality of conditional discharge paths, for precluding a connection of the precharge voltage to the precharge node of the second phase circuit during at least a first portion of the evaluate phase of the second phase circuit in response to any one of the signal inputs providing a second value that is complementary to the first value.

24. A dynamic logic hold time latch, comprising:
a first phase circuit operable in a precharge phase and an evaluate phase, wherein the first phase circuit comprises:
   a precharge node to be precharged to a precharge voltage during the precharge phase of the first phase circuit and operable to be discharged during the evaluate phase of the first phase circuit; and
   an output for providing a signal in response to a state at the precharge node of the first phase circuit; and
a second phase circuit operable in a precharge phase and an evaluate phase, wherein the precharge phase and the evaluate phase of the second phase circuit are out of phase with respect to the precharge phase and the evaluate phase of the first phase circuit, and wherein the second phase circuit comprises:
   a conditional discharge oath connected to the precharge node of the second phase circuit and operable, during the evaluate phase of the second phase circuit and in response at least in part to the output of the first phase circuit, to conditionally couple the precharge node of the second phase circuit to a voltage different than the precharge voltage;
      wherein the conditional discharge oath comprises at least one transistor of a first conductivity type and having a first threshold voltage; and
      wherein the first threshold voltage is lower than a threshold voltage of another transistor in the hold time latch having the first conductivity type;
   voltage maintaining circuitry, coupled to receive the output of the first phase circuit, for coupling the precharge voltage to the precharge node of the second phase circuit during the evaluate phase of the second phase circuit in response to the output of the first phase circuit providing a first value;
      wherein the voltage maintaining circuitry comprises at least one transistor of a second conductivity type, complementary to the first conductivity type, and having a second threshold voltage;
      wherein the second threshold voltage is lower than a threshold voltage of another transistor in the hold time latch having the second conductivity type; and
   wherein the voltage maintaining circuitry further comprises circuitry, coupled to receive the output of the first phase circuit, for precluding a connection of the precharge voltage to the precharge node of the second phase circuit during at least a first portion of the evaluate phase of the second phase circuit in response to the output of the first phase circuit providing a second value that is complementary to the first value.

25. The hold time latch of claim 24:
wherein the first conductivity type comprises n-type conductivity type; and
wherein the second conductivity type comprises p-type conductivity type.

26. The hold time latch of claim 24 wherein the voltage maintaining circuitry further comprises circuitry, coupled to receive the output of the first phase circuit, for precluding a connection of the precharge voltage to the precharge node of the second phase circuit during an entirety of the evaluate phase of the second phase circuit.

27. The hold time latch of claim 24:
wherein the second phase circuit further comprises an output for providing a signal in response to a state at the precharge node of the second phase circuit; and
wherein the voltage maintaining circuitry further comprises circuitry, coupled to the output of the second phase circuit, for coupling the precharge voltage to the precharge node of the second phase circuit during a remaining period of the evaluate phase of the second phase circuit, following the first portion of the evaluate phase of the second phase circuit, in response to the output of the second phase circuit providing the first value at a same time that the output of the first phase circuit provides the first value.

28. A dynamic logic hold time latch, comprising:
a first phase circuit operable in a precharge phase and an evaluate phase, and comprising:
   a precharge node to be precharged to a precharge voltage during the precharge phase of the first phase circuit and operable to be discharged during the evaluate phase of the first phase circuit; and
   an output for providing a signal in response to a state at the precharge node of the first phase circuit;
a second phase circuit operable in a precharge phase and an evaluate phase, wherein the precharge phase and the evaluate phase of the second phase circuit are out of phase with respect to the precharge phase and the evaluate phase of the first phase circuit, and wherein the second phase circuit comprises:
   a precharge node to be precharged to the precharge voltage during the precharge phase of the second phase circuit and operable to be discharged during the evaluate phase of the second phase circuit;
   a conditional discharge path connected to the precharge node of the second phase circuit and operable, during the evaluate phase of the second phase circuit and in response at least in part to the output of the first phase circuit, to conditionally couple the precharge node of the second phase circuit to a voltage different than the precharge voltage;
   voltage maintaining circuitry, coupled to receive the output of the first phase circuit, for coupling the precharge voltage to the precharge node of the second phase circuit during at least a portion of the evaluate phase of the second phase circuit during instances wherein the conditional discharge path is not enabled; and
   wherein the voltage maintaining circuitry is for coupling the precharge voltage to the precharge node of the second phase circuit during an entirety of the evaluate phase of the second phase circuit during instances wherein the conditional discharge path is not enabled.

29. The hold time latch of claim 28 wherein the instances wherein the conditional discharge path is not enabled occur when the output of the first phase circuit provides a signal that is disabling to at least one switching device in the conditional discharge path.

30. The hold time latch of claim 28 wherein the voltage maintaining circuitry is disabled from coupling the precharge voltage to the precharge node of the second phase circuit during the evaluate phase of the second phase circuit during instances wherein the conditional discharge path is enabled.

31. The hold time latch of claim 28 wherein the conditional discharge path is operable, during the evaluate phase of the second phase circuit, in response at least in part to the output of the first phase circuit and in addition to a signal from other than the first phase circuit, to conditionally couple the precharge node of the second phase circuit to a voltage different than the precharge voltage.

32. The hold time latch of claim 31 the wherein voltage maintaining circuitry is for coupling the precharge voltage to the precharge node of the second phase circuit during a latter portion of the evaluate phase of the second phase circuit during instances wherein the signal from other than the first phase circuit is enabling to a device in the conditional discharge path.

33. A method of operating a dynamic logic hold time latch, comprising:
operable in a precharge phase and an evaluate phase, and comprising:
in a first phase circuit, precharging a precharge node to a precharge voltage during a precharge phase of the first phase circuit;
in a second phase circuit, precharging a precharge node to a precharge voltage during a precharge phase of the second phase circuit;
in the first phase circuit, ending the precharge phase such that the precharge voltage may be discharged during an evaluate phase of the first phase circuit;
in the second phase circuit, ending the precharge phase such that during an evaluate phase of the second phase circuit the precharge voltage at the precharge node of the second phase circuit may be discharged through a conditional discharge path, wherein the conditional discharge path is operable to conduct in response to an output from the first phase circuit and generated in response to the evaluate phase of the first phase circuit;
in response to the output of the first phase circuit, coupling the precharge voltage to the precharge node of the second phase circuit during at least a portion of the evaluate phase of the second phase circuit during instances wherein the conditional discharge path is not enabled; and
wherein the conditional discharge path is operable, during the evaluate phase of the second phase circuit, in response at least in part to the output of the first phase circuit and in addition to a signal from other than the first phase circuit, to conditionally couple the precharge node of the second phase circuit to a voltage different than the precharge voltage.

34. The method of claim 33 and further comprising coupling the precharge voltage to the precharge node of the second phase circuit during an entirety of the evaluate phase of the second phase circuit during instances wherein the conditional discharge path is not enabled.

35. The method of claim 34 wherein the instances wherein the conditional discharge path is not enabled occur when the output of the first phase circuit provides a signal that is disabling to at least one switching device in the conditional discharge path.

36. The method of claim 33 and further comprising disabling the precharge voltage from the precharge node of the second phase circuit during the evaluate phase of the second phase circuit during instances wherein the conditional discharge path is enabled.

37. The method of claim 33 and further comprising coupling the precharge voltage to the precharge node of the second phase circuit during a latter portion of the evaluate phase of the second phase circuit during instances wherein the signal from other than the first phase circuit is enabling to a device in the conditional discharge path.

* * * * *